United States Patent [19]

Matthews

[11] Patent Number: 4,920,320

[45] Date of Patent: Apr. 24, 1990

[54] PHASE LOCKED LOOP WITH OPTIMALLY CONTROLLED BANDWIDTH

[75] Inventor: Lloyd P. Matthews, Buda, Tex.

[73] Assignee: Motorola, Inc., Schaumburg, Ill.

[21] Appl. No.: 285,997

[22] Filed: Dec. 19, 1988

[51] Int. Cl.$^5$ .................... H03K 17/00; H03L 7/00

[52] U.S. Cl. .................... 328/155; 328/167; 307/262; 307/521; 331/1 A; 331/17; 331/25

[58] Field of Search ............... 328/155, 167; 307/262, 307/520, 521; 331/1 A, 14, 17, DIG. 2

[56] References Cited

U.S. PATENT DOCUMENTS

| | | | |
|---|---|---|---|
| 3,729,688 | 4/1973 | Cerny et al. | 331/1 A |
| 4,135,165 | 1/1979 | Coe | 331/1 A |
| 4,330,758 | 5/1982 | Swisher et al. | 331/16 |
| 4,482,869 | 11/1984 | Hirata | 331/17 |
| 4,500,857 | 2/1985 | Bosselaers et al. | 331/17 |
| 4,516,083 | 5/1985 | Turney | 331/17 |
| 4,745,371 | 5/1988 | Haine | 331/17 |
| 4,774,480 | 9/1988 | Sato et al. | 331/1 A |
| 4,816,770 | 3/1989 | Naumann | 331/17 |
| 4,829,268 | 5/1989 | Leuthold et al. | 331/17 |

*Primary Examiner*—Stanley D. Miller
*Assistant Examiner*—Timothy P. Callahan
*Attorney, Agent, or Firm*—Robert L. King

[57] ABSTRACT

A phase locked loop has a digital phase comparator, a filter with multiple bandwidths, a voltage controlled oscillator and a frequency divider connected to the phase comparator to complete the loop. Control circuitry is coupled to both the phase comparator and filter for controlling switching between a wide bandwidth and a narrow bandwidth. The switching in bandwidth is in response to either detecting when the output signal is within a predetermined range of the reference frequency for a predetermined time period or detecting when the output signal exceeds and falls below the reference frequency a predetermined number of times. The control circuit is implemented with circuitry which accurately detects either condition and is capable of blocking any premature change of bandwidth.

6 Claims, 2 Drawing Sheets

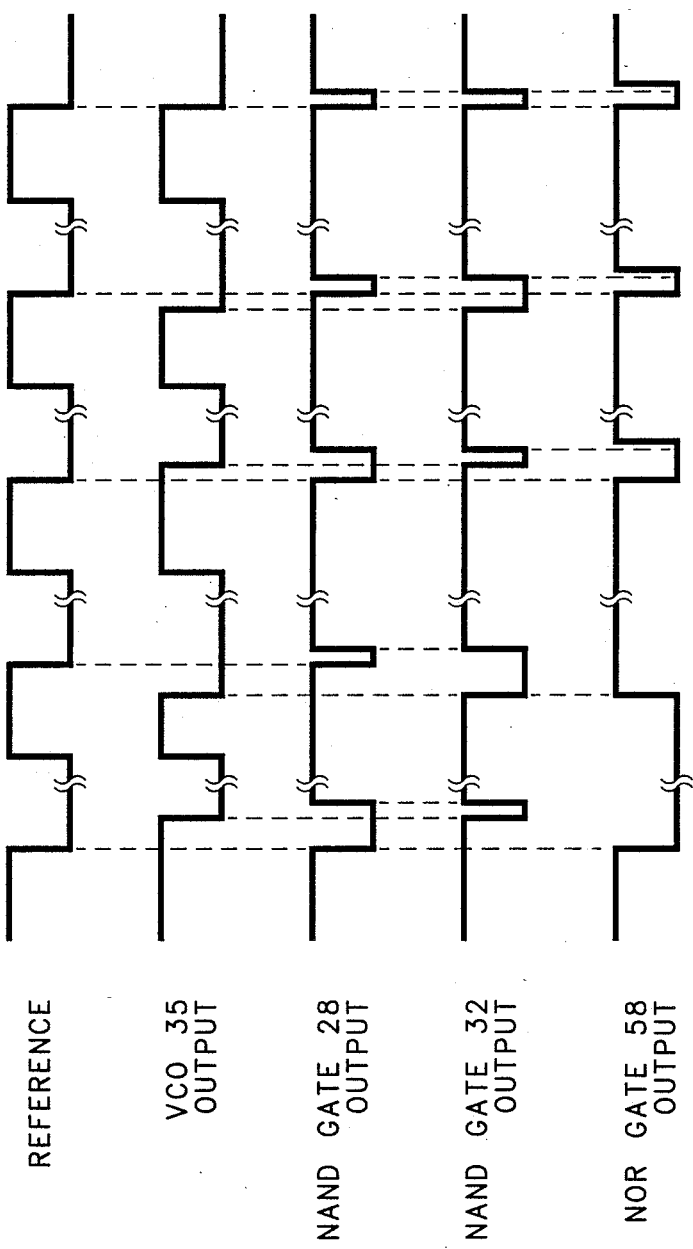

PHASE LOCKED LOOP WITH OPTIMALLY CONTROLLED BANDWIDTH

FIELD OF THE INVENTION

This invention relates generally to digital circuits, and more particularly, to a digital phase locked loop circuit.

BACKGROUND OF THE INVENTION

Phase locked loop circuits (PLLs) typically receive a predetermined reference frequency and provide a locked output signal having a predetermined multiple of the reference frequency. Generally, a phase detector compares the reference frequency with the output signal after the output signal is divided by the predetermined multiple. The phase detector provides a control signal in response to the comparison. The control signal may then be used by a voltage controlled oscillator (VCO) which provides the output signal and varries the output signal in response to the control signal. A frequency divider for dividing the output signal is coupled between the VCO and phase detector to complete a circuit loop. Such a phase locked loop is disclosed by Ken Burch and Wendell Little in U.S. Pat. No. 4,771,249 entitled "Phase Locked Loop Having A Filter With Controlled Variable Bandwidth" and assigned to the assignee hereof. Burch et al. teach a PLL which uses two filters wherein a first filter has a large bandwidth and the second filer has a mcuh smaller bandwidth. A large bandwidth filter is particularly useful when trying to obtain quick circuit operation at a locked frequency, and a small bandwidth filter is more useful for maintaining stable circuit operation. Burch et al. propose a PLL which uses control circuitry for counting a predetermined number of times the output signal exceeds and falls below a reference frequency before switching from a large bandwidth fiter to a narrow bandwidth filter. Depending upon the control circuitry used, digital pulses may be inadvertently generated resulting in a switch of filters occurring prematurely. Also, in a highly damped PLL system, the output signal may approach the reference signal in a very slow controlled pattern which exceeds the reference frequency only substantially later than when the narrow bandwidth filter is optimally required.

BRIEF DESCRIPTION OF THE INVENTION

Accordingly it is an object of the present invention to provide an improved phase locked loop circuit having optimally controlled bandwidth.

It is another object of the present invention to provide an improved digital control circuit for use in a phase locked loop circuit.

It is yet another object of the present invention to provide an improved method for locking an output signal's frequency to a reference frequency in a PLL circuit having a filter with variable controlled bandwidth.

In carrying out these and other objects of the invention, there is provided, in one form, a method and circuit for controlling bandwidth in a filter of a phase clocked loop to improve speed and stability. The phase locked loop receives an input reference frequency and filters a phased compared signal to provide a control voltage. The control voltage is coupled to an oscillator circuit to provide an output signal which is phase locked to the input reference frequency. The output signal has a frequency which varies in proportion to the control signal. The output signal is divided by an integer multiple to provide a feedback frequency having a fundamental frequency of the output signal. The phase of the input reference frequency is compared with the phase of the feedback frequency to provide the phase compared signal. The filter is placed in a first bandwidth in response to the compared phase being greater than a predetermined ratio. The filter is subsequently placed in a second bandwidth in response to either detecting when the output signal is within a predetermined range of the reference frequency for a predetermined time period or detecting when the output signal exceeds and falls below a predetermined frequency a predetermined number of times. The second bandwidth is substantially narrower than the first bandwidth.

These and other objects, features and advantages will be more clearly understood from the following detailed description taken in conjunction with the accompanying drawings.

BRIEF DESCRIPTION OF THE DRAWINGS

FIG. 2 illustrates in graphical form signals associated with the operation of the phase locked loop of FIG. 1.

DETAILED DESCRIPTION OF THE INVENTION

Figure 1:
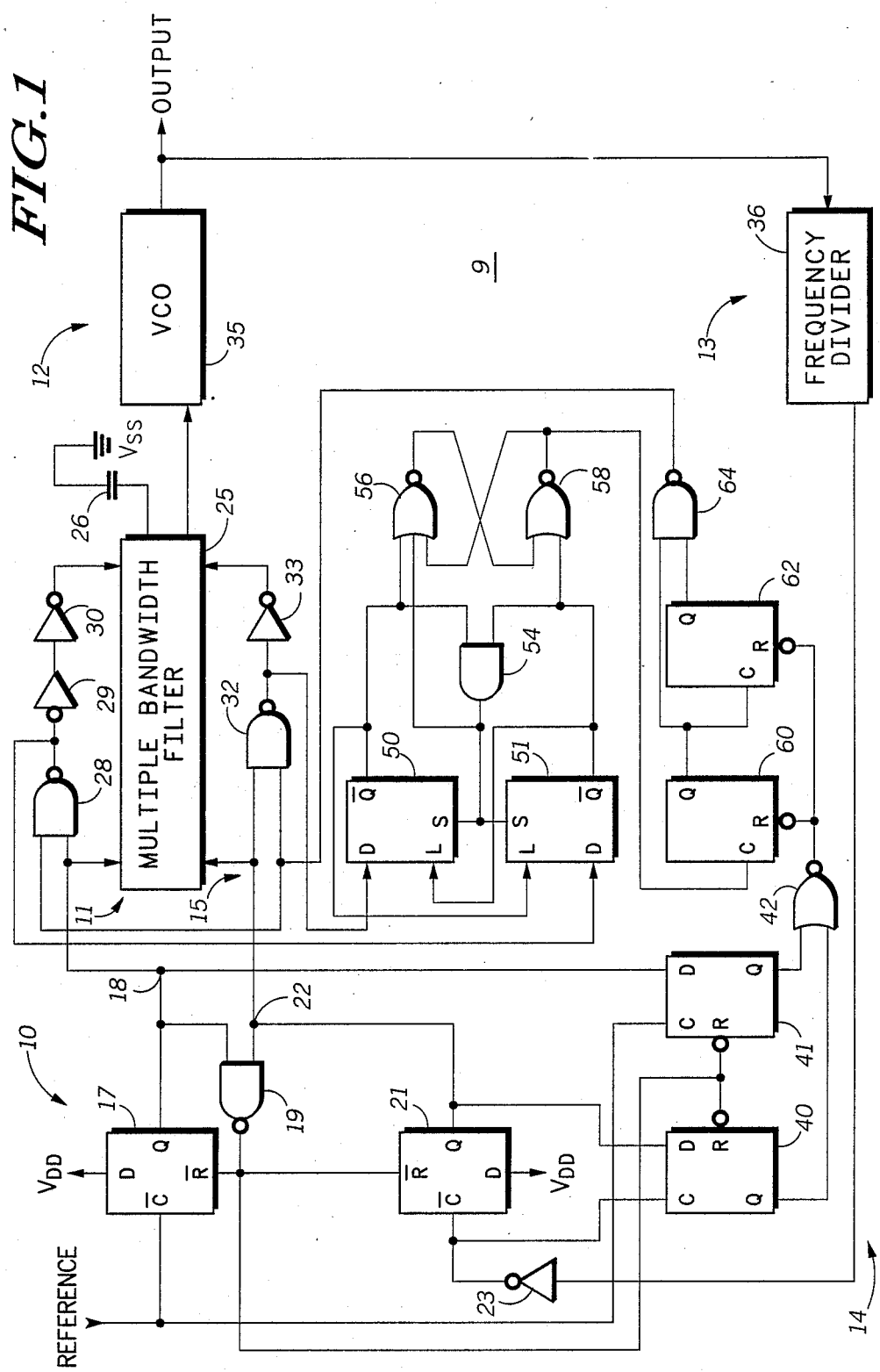
FIG. 1 illustrates a block diagram form a phase locked loop in accordance with the present invention.

Shown in the Figure is a phase locked loop 9 generally comprising a digital phase comparator portion 10, a filter portion 11, a voltage controlled oscillator (VCO) portion 12, a frequency divider portion 13, a harmonic control portion 14 and a bandwidth control portion 15. Phase comparator portion 10 comprises a D-type flip-flop circuit 17 having a data input labeled "D" connected to a power supply voltage labeled "$V_{DD}$". A complementary clock input of flip-flop 17 is coupled to a reference frequency labeled "Reference". A data output labeled "Q" of flip-flop 17 is connected to a first input of a NAND gate 19 via a node 18. An output of NAND gate 19 is connected to a complementary reset input labeled "R" of both flip-flop 17 and a flip-flop 21. A data input of flip-flop 21 is connected to power supply voltage $V_{DD}$. A data output labeled "Q" of flip-flop 21 is connected to a second input of NAND gate 19 via a node 22. An inverter 23 has an output connected to a complementary clock input of flip-flop 21.

Filter portion 11 comprises a multiple bandwidth filter 25 having four control inputs and two outputs. In a preferred form, multiple bandwidth fiter 25 comprises two bandwidths, but it should be understood that more than two bandwidths may be included. A first of the two bandwidths is a wide bandwidth, and a second of the two bandwidths is a narrow bandwidth. A capacitor 26 has a first electrode connected to a first output of multiple bandwidth filter 25, and a second electrode connected to a ground reference voltage terminal labeled $V_{SS}$. Bandwidth filter control circuitry comprises a NAND gate 28 and inverters 29 and 30. A first input of NAND gate 28 is connected to both the Q data output of flip-flop 17 at node 18 and to a first control input of filters 25. An output of NAND gate 28 is connected to an input of inverter 29, and an output of inverter 29 is connected to an input of inverter 30. An output of inverter 30 is connected to a second control input of multiple bandwidth filter 25. The bandwidth filter control circuitry further comprises a NAND gate 32 and an inverter 33. A first input of NAND gate 32 is connected to both node 22 and to the third control input of multiple bandwidth filter 25. A second input of NAND gate 32 is connected to a second input of NAND gate 28. An output of NAND gate 32 is connected to an input of inverter 33. An output of inverter 33 is connected to the fourth control input of multiple bandwidth filter 25. An output of multiple bandwidth filter 25 is connected to an input of a VCO 35 of voltage controlled oscillator portion 12. An output of VCO 35 provides the output signal of phase locked loop 9 and is connected to an input of a frequency divider circuit 36 of frequency divider portion 13. An output of frequency divider circuit 36 is connected to an input of inverter 23 of digital phase comparator portion 10.

Harmonic control portion 14 generally comprises flip-flop circuits 40 and 41 and OR gate 42. A clock input of flip-flop 40 labeled "C" is connected to the clock input of flip-flop 21. A data input of flip-flop 40 labeled "D" is connected to the data output labeled "Q" of flip-flop 21. A reset input labeled "R" of flip-flop 40 is connected to both the output of NAND gate 19 and to a reset input of flip-flop 41. A clock input of flip-flop 41 is connected to the reference frequency input signal, and a data input of flip-flop 41 is connected to the Q data output of flip-flop 17 at node 18. A data output of flip-flop 40 labeled "Q" is connected to a first input of OR gate 42, and a data output of flip-flop 41 also labeled "Q" is connected to a second input of OR gate 42.

Bandwidth control portion 15 comprises cross-coupled latches 50 and 51, AND gate 54, NOR gates 56 and 58 which forms an RS latch, flip-flops 60 and 62 and a NAND gate 64. A data input labeled "D" of latch 50 is connectd to the output of NAND gate 32. A complementary data output labeled "Q" of latch 50 is connected to a latch input labeled "L" of latch 51, to a first input of AND gate 54 and to a first input of NOR gate 56. A complementary data output labeled "Q" of latch 51 is connected to a latch input labeled "L" of latch 50, to a second input of AND gate 54 and to a first input of NOR gate 58. An output of AND gate 54 is connected to set inputs of latches 50 and 51, each labeled "S", and to a second input of NOR gate 56. An output of NAND gate 28 is connected to a data input labeled "D" of latch 51. An output of NOR gate 56 is connected to a second input of NOR gate 58, and an output of NOR gate 58 is connected to a third input of NOR gate 56. The output of NR gate 58 is also connected to a clock input labeled "C" of flip-flop 60. A data output of flip-flop 60 labeled "Q" is connected to both a clock input labeled "C" of flip-flop 62 and to a first input of NAND gate 64. A data output labeled "Q" of flip-flop 62 is connected to a second input of NAND gate 64. An output of NOR gate 42 is connected to a reset input labeled "R" of both flip-flips 60 and 62. An output of NAND gate 64 provides a filter control signal and is connected to both of the second inputs of NAND gates 28 and 32.

In general, phase locked loop 9 functions to provide an output signal at the output of VCO 35 which has the same frequency as a multiple of the reference frequency. Digital phase comparator 10 functions to compare the phase of the reference frequency with the output signal which is fed back to digital phase comparator 10. Filter portion 11 functions to filter an output of phase detector 10 and provide a control signal in response to the value of the output of digital phase comparator 10. The output of digital phase comparator 10 indicates how close the phases of the reference signal and the output signal are to each other. With the control signal provided by filter portion 11, VCO 35 provides an output signal having a frequency directly proportional to the magnitude of the control signal. In order to compare the phase of the output signal with the phase of the reference signal to determine if the output signal has the correct frequency, frequency divider 36 is used to divide the frequency of the output signal back down to the fundamental frequency of the reference signal. Control portion 15 functions to switch filter portion 11 between a wide bandwidth mode of operation and a narrow bandwidth mode of operation depending upon how close to the correct frequency the output signal is. During initial circuit operation, the output signal may vary widely and a wide bandwidth of operation is needed for filter portion 11. Flip-flops 40 and 41 function to insure that if the output signal is widely varying by more than a predetermined factor, such as two, that phase locked loop 99 cannot enter a narrow bandwidth mode. When the output signal is substantially close to the desired frequency, a narrow bandwidth will provide much more stable circuit operation, and control portion 15 switches filter 25 to a narrow bandwidth mode of operation. Up to this point in the discussion, the operation of phase locked loop 9 is analogous to the phase locked loop taught by Burch et al. in U.S. Pat. No. 4,771,249 referenced above.

In the present invention, phase locked loop 9 is capable of providing a loked output signal in a heavily damped mode of operation without having to wait until the output signal has exceeded and fallen below a predetermined frequency a predetermined number of times. In a damped system, a very large value of capacitance is used for capacitor 26. As a result, the output signal may approach the predetermined desired frequency so slowly that the output signal could be virtually at the frequency to be locked for a significant amount of time while filter portion 11 is still in the wide bandwidth mode of operation. The present invention functions to allow filter portion 11 to switch to the narrow bandwidth range for the above mentioned circuit condition without having to count the output signal going above and below the desired frequency a certain number of times before switching bandwidth range.

Another common problem which the present invention avoids relates to the generation of pulses by a digital phase comparator circuit. As illustrated in FIG. 2, an overlapping of output clock pulses may occur at the outputs at nodes 18 and 22 of digital phase comparator 10. Those appear at the outputs of NAND gates 28 and 32. The overlap is a result of the finite reset time associated with flip-flops 17 and 21 used for the phase detector. There will always be a small pulse generated by phase comparator 10 in response to the later occurring of the reference signal or the VCO signal regardless of how much later the second occurring signal appears. The reset of the two D latches 17 and 21 removes both pulses simultaneously. Without the cross-coupled latches 50 and 51, the above mentioned pulses will produce an invalid state to the RS latch formed by NOR gates 56 and 58. The result of the invalid state is that the final state of the RS latch is unknown when the pulses return to the reset logic levels. The output of the RS latch may either remain at a low logic level and not produce a pulse to flip-flops 60 and 62, or may produce an unwanted clocking edge. When unwanted clocking edges are erroneously counted by flip-flops 60 and 62, filter 255 may be switched to a narrow bandwidth very prematurely. To prevent this error, the cross-coupled latches 50 and 51 block the later of the two pulses so that only the first of the pulses reaches the RS latch 5 allowing the latch to toggle in a predictable operation which does not generate unwanted clock edges.

Shown in FIG. 2 are examples of various clock signals which may occur during the operation of phase locked loop 9 which illustrate the present invention. Assume initially that the reference frequency signal transitions frorm a high logic level to a low logic level before the VCO signal transitions from a high logic level to a low logic level. Assume that nodes 18 and 22 are both initially at logic low level. In this mode, the outputs of NAND gates 28 and 32 and NOR gate 58 are at a logic high level. The change by the reference signal from a logic high level to a logic low level causes node 18 to rise to a logic high level and the output of NAND gate 28 to fall to a logic low level. The output of NAND gate 28 causes the output of latch 51 to transition from a logic low level to a logic high level which causes latch 50 to store a logic low level. The output of the RS latch provided by NOR gate 58 transitions from a logic high level to a logic low level. A pulse is generated by flip-flop 21 as a result of the action of VCO 35. When this pulse propagates thru NAND gate 32, a resultant logic low level pulse appears at the output NAND gate 32. The logic low level pulse is blocked by latch 50 from being coupled to the RS latch formed by NOR gates 56, 58.

After some period in time as noted in FIG. 2, the VCO signal transitions from a logic high to logic low level before the referrence signal does so. Assume that nodes 18 and 22 are initially at a logic low level. In this mode, the outputs of NAND gates 28 and 32 are at a logic high level and NOR gate 58 is at a logic low level. The change by the VCO signal form a logic high level to a logic low level causes node 22 to rise to a logic high level and the output of NAND gate 32 to fall to alogic low level. The output of NAND gate 32 causes the output of latch 50 to transition from a logic low to a logic high level which causes latch 51 to store a logic low level. The output of the RS latch NOR gate 58 transitions from a logic low level to a logic high level which now produces the first clocking edge for the counter comprised of flip-flops 60 and 62. When the pulse generated by flip-flop 17 being clocked as a result of the reference signal propagates thru NAND gate 28, it appears at the output of NAND gate 28 as a logic low level. The logic low level is blocked by latch 51 from being coupled to the RS latch comprising NOR gates 56 and 58.

Subsequently in time as illustrated in FIG. 2, the reference frequency transitions frorm a logic high level to logic low level at a very short time period before the VCO signal similarly transitions. In this situation, the VCO signal is substantially at the correct frequency and phase locked loop 9 is very near its locked mode of operation. Nodes 22 and 18 respectively transition from logic low levels to logic high levels in response to the VCO and reference signal transitioning. In this case, the transitions produced at the outputs of NAND gates 28 and 32 propagate thru latches 50 and 51 to produce low to high transitions which simultaneously latch both latches 50 and 51. This also causes the output of the RS latch NOR gate 58 to transition from a logic high level to a logic low level. The inputs of AND gate 54 are at a logic high level which causes a low to high transition to be applied to the set input of latches 50 and 51. This transition on the set input causes the outputs of latches 50 and 51 to transition from a logic high level to a logic low level. The outputs of latches 50 and 51 transition from high to low while the output of AND gate 54 is still at a logic high level. A logic low level at the inputs of AND gate 54 also appears at the inputs of NOR gates 56 and 58. Simultaneously, a logic high level remains at the output of AND gate 54 for a predetermines finite amount of time due to circuit design physical characteristics. The logic high level at the output of AND gate 54 is applied to the second input of NOR gate 56 which forces the output of NOR gate 56 to a low logic level. The logic low level on the output of NOR gate 56 is applied to the second input of NOR gate 58. As previously stated, a logic low level is present at the first input of NOR gate 58. This forces the RS latch output NOR gate 58 to transition from a logic low to a logic high level which clocks the counter comprising flip-flops 60 and 62.

In yet another period in time as illustrated in FIG. 2, the reference frequency transitions from a logic high level to a logic low level at a very short time period after the VCO signal similarly transitions. Again, the VCO signal is substantially at the correct frequency and phase locked loop 9 is very near its locked mode of operation. Nodes 22 and 18 respectively transition from logic low levels to logic high levels in response to the VCO and reference signal transitioning. In this case, the transitions produced at the outputs of NAND gates 28 and 32 propagate thru latches 50 and 51 to produce low to high transitions which simultaneously latch both latches 50 and 51. This also causes the output of the RS latch NOR gate 58 to transition from a logic high level to a logic low level. The inputs of AND gate 54 are at a logic high level which caues a low to high transition to be applied to the set input of latches 50 and 51. This transition on the set input causes the outputs of latches 50 and 51 to transition from a logic high level to a logic low level. The outputs of latches 50 and 51 are transitioning from high to low levels while the output of AND gate 54 is still at a logic high level. A logic low level at the inputs of AND gate 54 also appears at the inputs of NOR gates 56 and 58. Simultaneously, a logic high level remains at the output of AND gate 54 for a predetermined finite amount of time due to circuit design physical characteristics. The logic high level at the output of AND gate 54 is applied to the second input of NOR gate 56 which forces the output of NOR gate 56 to a low logic level. The logic low level on the output of NOR gate 56 is applied to the second input of NOR gate 58. As previously stated, a logic low level is present at the first input of NOR gate 58. This forces the RS latch output NOR gate 58 to transition from a logic low to a logic high level which clocks the counter comprising flip-flops 60 and 62. As can be readily determined, the circuit operation of control portion 15 is identical regardless of order of transition of the reference signal and VCO signal as long as each transition occurs within a predetermined range of time.

In the final time period illustrated in FIG. 2, the reference frequency transitions from a logic high level to a logic low level essentially simultaneously with the VCO signal transition. In this situation, the VCO signal is at the correct frequency and phase locked loop 9 will lock provided the counter formed by flip-flops 60 and 62 counts this condition for a predetermined number of times. Nodes 22 and 18 respectively transition from logic low levels to logic high levels in response to the VCO and reference signal transitioning. In this case, the transitions produced at the outputs of NAND gates 28 and 32 propagate thru latches 50 and 51 to produce low to high transitions which simultaneously latch both latches 50 and 51. This also causes the output of the RS latch NOR gate 58 to transition from a logic high level to a logic low level. The inputs of AND gate 54 are at a high logic level which causes a low to high transition to be applied to the set input of latches 50 and 51. This transition on the set input causes the outputs of latches 50 and 51 to transition from a high logic level to a low logic level. The outputs of latches 50 and 51 are transitioning from high to low while the output of AND gate 54 is still at a logic high level. A logic low level at the inputs of AND gate 54 also appears at the inputs of NOR gates 56 and 58. Simultaneously, a logic high level remains at the output of AND gate 54 for a predetermined finite amount of time due to circuit design physical characteristics. The logic high level at the output of AND gate 54 is applied to the second input of NOR gate 56 which forces the output of NOR gate 56 to a low logic level. The logic low level on the output of NOR gate 56 is applied to the second input of NOR gate 58. As previously stated, a logic low level is present at the first input of NOR gate 58. This forces the RS latch output NOR gate 58 to transition from a logic low to a logic high level which clocks the counter comprising flip-flops 60 and 62. Again, the circuit operation of control portion 15 is identical regardless of order of transition of the reference signal and VCO signal as long as each transition occurs within a predetermined range of time.

By now it should be apparent that a versatile phase locked loop has been provided. The present invention functions to optimally control the bandwidth of a PLL regardless of how much damping exists in the PLL. The control circuitry of the present invention allows conventional digital phase comparator circuitry to be used, and does not prematurely change the bandwidth of the PLL.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

I claim:

1. A method for controlling bandwidth in a filter of a digital phase locked loop to improve speed and stability, comprising the steps of:
   receiving an input reference frequency signal having a predetermined phase;
   filtering a phase compared signal to provide a control voltage;
   coupling the control voltage to an oscillator circuit to provide an output signal which is phase locked to the input reference frequency, said output signal having a frequency varying in proportion to the control signal;
   dividing the output signal by an integer multiple to provide a feedback signal having a fundamental frequency of the output signal and a phase; and
   comparing the phase of the input reference frequency signal with the phase of the feedback signal to provide the phase compared signal in response thereto, wherein the improvement comprises:
   placing the filter in a first predetermined bandwidth in response to a ratio of the phases of the input reference frequency signal and the feedback signal being greater than a predetermined ratio; and either
   detecting with a plurality of digital logic gates when the output signal is within a predetermined range of the reference frequency for a predetermined time period by providing a digital counter with a count signal in response to a predetermined number of level transitions of at least one of the input reference frequency signal or feedback signal and counting a predetermined number of count signals, or
   counting with the digital counter to detect when the output signal exceeds and falls below a predetermined frequency a predetermined number of times, before placing the digital filter in a second predetermined bandwidth substantially narrower than the first bandwidth in response thereto.

2. A digital phase locked loop circuit having a filter with controlled variable bandwidth and which provides an output signal which is locked to a predetermined frequency, comprising:
   input means having a first input for receiving a reference frequency and a second input for receiving a fundamental frequency of the output signal, said input means comparing the phase of the reference and fundamental frequencies and providing first and second phase signals indicating the phase of each frequency with respect to the other frequency;
   filter means coupled to the input means for receiving the first and second phase signals and filtering the reference frequency to provide a control signal, the control signal having an amplitude proportional to the first and second phase signals;
   oscillator means having an input coupled to the filter means for receiving the control signals, and an output for providing the output signal in response to the control signal;
   frequency divider means coupled to the output of the oscillator means, for receiving the output signal and dividing the output signal by a predetermined multiple to provide the fundamental frequency,
   wherein the improvement comprises:
   digital control means coupled to the filter means for placing the filter means in a first predetermined bandwidth in response to a ratio of the phases of the reference frequency signal and feedback signal being greater than a predetermined ratio, and either
   digitally detecting when the output signal is within a predetermined range of the reference frequency for a predetermined amount of time by latching and counting logic level transitions of the reference and fundamental frequencies which occur within the predetermined amount of time; or
   digitally detecting when the output signal exceeds and falls below a predetermined frequency a predetermined number of times, and
   placing the filter means in a second predetermined bandwidth substantially narrower than the first bandwidth in response to said detecting.

3. The phase locked loop circuit of claim 2 wherein said digital control means further comprise:
  counter means having an input and an output, said counter means counting the predetermined number of times that the output signal exceeds and falls below the pedetermined frequency;
  a first NAND gate having a first input coupled to the first phase signal and to a first phase signal input of the filter means, a second input coupled to the output of the counter means, and an output;
  a first inverter having an input coupled to the output of the first NAND gate, and an output;
  a second inverter having an input coupled to the output of the first inverter, and an output coupled to a first bandwidth control input of the filter means;
  a second NAND gate having a first input coupled to the second phase signal and to a second phase signal input of the filter means, a second input coupled to the output of the counter means, and an output;
  a third inverter having an input coupled to the output of the second NAND gate, and an output coupled to a second bandwidth control input of the filter means;
  a first latch having a latch input, a data input coupled to the output of the second NAND gate, a set input, and an output;
  a second latch having a latch input coupled to the output of the first latch, a data input coupled to the output of the first NAND gate, a set input coupled to the set input of the first latch, and an output coupled to the latch input of the first latch;
  an AND gate having a first input coupled to the output of the first latch, a second input coupled to the output of the second latch, and an output coupled to the set input of both the first and second latches;
  a first NOR gate having a first input coupled to the output of the first latch, a second input coupled to the output of the AND gate, a third input, and an output; and
  a second NOR gate having a first input coupled to the output of the first NOR gate, a second input coupled to the output of the second latch, and an output coupled to both the third input of the first NOR gate and to an input of the counter means.

4. The digital phase locked loop circuit of claim 3 wherein said counter means further comprise:
  a first flip-flop circuit having a clock input coupled to the output of the second NOR gate, a reset input, and an output;
  a second flip-flop circuit having a clock input coupled to the output of the first flip-flop, a reset input, and an output; and
  a third NAND gate having a first input coupled to the output of the first flip-flop circuit a second input coupled to the output of the second flip-flop circuit, and an output coupled to the second inputs of the first and second NAND gates.

5. The digital phase locked loop circuit of claim 4 further comprising:
  harmonic control means coupled to the reset inputs of the first and second flip-flop circuits for resetting the first and second flip-flop circuits when the output signal varies by more than a predetermined factor.

6. A digital phase locked loop circuit havng a filter with controlled variable bandwidth and which provides an output signal which is locked to a predetermined frequency, comprising:
  input means having a first input for receiving a reference frequency and a second input for receiving a fundamental frequency of the output signal, said input means comparing the phase of the reference and fundamental frequencies and providing first and second phase signals indicating the phase of each frequency with respect to the other frequency;
  filter means coupled to the input means for receiving the first and second phase signals and filtering the reference frequency to provide a control signal, the control signal having an amplitude proportional to the first and second phase signals;
  oscillator means having an input coupled to the filter means for receiving the control signal, and an output for providing the output signal in response to the control signal;
  frequency divider means coupled to the output of the oscillator means, for receiving the output signal and dividing the output signal by a predetermined multiple to provide the fundamental frequency,
  wherein the improvement comprises:
    digital control means coupled to the filter means for placing the filter means in a first predetermined bandwidth in response to a ratio of the phase of the reference and fundamental frequencies being greater than a predetermined ratio, and either
    digitally detecting when the fundamental frequency is within a predetermined range of the reference frequency for a predetermined amount of time by latching and counting logic level transitions of the reference and fundamental frequencies which occur within the predetermined amount of time, said digital control means having logic means for allowing only one logic level transition to be counted when said reference and fundamental frequencies each transition in level within a second predetermined amount of time, or
    digitally detecting when the output signal exceeds and falls below a predetermined frequency a predetermined number of times,
    said digital control means placing the filter means in a second predetermined bandwith substantially narrower than the first bandwidth in response to said detecting.

* * * * *